(12) United States Patent
Darmann

(10) Patent No.: US 6,842,634 B2
(45) Date of Patent: Jan. 11, 2005

(54) INTEGRATED TAPE

(75) Inventor: Francis Anthony Darmann, Mount Kuring-Gai (AU)

(73) Assignee: Metal Manufacturers Limited, North Rocks (AT)

( * ) Notice: Subject to any disclaimer, the term of this patent is extended or adjusted under 35 U.S.C. 154(b) by 0 days.

(21) Appl. No.: 10/437,246

(22) Filed: May 14, 2003

(65) Prior Publication Data

US 2003/0201119 A1 Oct. 30, 2003

Related U.S. Application Data

(63) Continuation of application No. 09/661,251, filed on Sep. 13, 2000, now abandoned, which is a continuation of application No. PCT/AU99/00182, filed on Mar. 18, 1999.

(30) Foreign Application Priority Data

Mar. 18, 1998 (GB) .............................................. 9805639

(51) Int. Cl.⁷ ........................... H01B 12/00; H01F 6/00; H01L 39/00
(52) U.S. Cl. ................... 505/231; 428/114; 428/293.1; 428/374; 428/930; 174/125.1
(58) Field of Search ............................ 428/114, 293.1, 428/373, 374, 377, 930; 505/230, 231, 232, 236, 704, 705, 884, 886, 887, 879; 174/125.1, 129.5

(56) References Cited

U.S. PATENT DOCUMENTS

| | | |
|---|---|---|
| 4,994,435 A | 2/1991 | Shiga et al. |
| 5,059,582 A | 10/1991 | Chung |
| 5,104,849 A | 4/1992 | Shiga et al. |
| 5,122,507 A | 6/1992 | Yamamoto et al. |
| 5,151,406 A | 9/1992 | Sawada et al. |
| 5,189,260 A | 2/1993 | Finnemore et al. |
| 5,192,739 A | 3/1993 | Lay |
| 5,208,215 A | 5/1993 | Chen et al. |
| 5,232,908 A | 8/1993 | Shiga et al. |
| 5,288,699 A | 2/1994 | Sato et al. |
| 5,347,085 A | 9/1994 | Kikuchi et al. |
| 5,360,784 A | 11/1994 | Kimura et al. |
| 5,398,398 A | 3/1995 | Williams et al. |
| 5,508,254 A | 4/1996 | Sato et al. |
| 5,516,573 A | 5/1996 | George et al. |
| 5,516,753 A | 5/1996 | Ohkura et al. |

(List continued on next page.)

FOREIGN PATENT DOCUMENTS

| | | |
|---|---|---|
| EP | 0 282 286 A2 | 9/1988 |
| EP | 0 356 969 A2 | 3/1990 |
| EP | 0 357 779 A1 | 3/1990 |
| JP | 6-309955 | 11/1994 |
| JP | 0925960 A | 10/1997 |
| JP | 10-223070 | 8/1998 |
| JP | 11-25771 | 1/1999 |
| JP | 11-25772 | 1/1999 |
| WO | WO 00/02208 A1 | 1/2000 |
| WO | WO 01/71733 A1 | 9/2001 |

*Primary Examiner*—Stanley S. Silverman
*Assistant Examiner*—Colleen P. Cooke
(74) *Attorney, Agent, or Firm*—Fay Kaplun & Marcin, LLP

(57) ABSTRACT

Production of a superconducting tape of the powder-in-tube type comprising multiple filaments (1) of superconducting material embedded in a silver matrix (2) having the properties of a filament thickness of less than about 40 μm and an overall tape thickness in the range from about 0.45 mm to 1.20 mm. A superconducting power cable including a tubular copper former (3) defining a cooling duct (4) about which superconducting tape is helically laid in two layers of either the same or opposite hand. The cable further includes thermal insulation (5), an electrical screen (6), electrical insulation (7), a further electrical screen (8) and containment (9).

15 Claims, 5 Drawing Sheets

U.S. PATENT DOCUMENTS

| | | |
|---|---|---|
| 5,801,124 A | 9/1998 | Gamble et al. |
| 5,846,910 A | 12/1998 | Funahashi et al. |
| 5,849,670 A | 12/1998 | Nabatame et al. |
| 5,929,000 A | 7/1999 | Hahakura et al. |
| 5,987,342 A | 11/1999 | Scudiere et al. |
| 6,074,991 A | 6/2000 | Jenovelis et al. |
| 6,110,873 A | 8/2000 | Duperray et al. |
| 6,192,573 B1 | 2/2001 | Hahakura et al. |
| 6,271,474 B1 | 8/2001 | Fujikami et al. |
| 6,272,730 B1 | 8/2001 | Gherardi et al. |
| 6,272,731 B1 | 8/2001 | Leriche et al. |
| 6,284,979 B1 | 9/2001 | Malozemoff et al. |
| 6,305,069 B1 | 10/2001 | Fujikami et al. |
| 6,344,430 B1 | 2/2002 | Duperray et al. |
| 6,349,226 B1 | 2/2002 | Yoshino et al. |
| 6,360,425 B1 | 3/2002 | Christopherson et al. |
| 6,370,405 B1 | 4/2002 | Riley, Jr. et al. |
| 6,381,832 B1 | 5/2002 | Kaneko |
| 6,387,852 B1 | 5/2002 | Celik et al. |
| 6,442,827 B1 | 9/2002 | Herrmann et al. |
| 6,444,917 B1 | 9/2002 | Scudiere et al. |
| 6,466,805 B2 | 10/2002 | Balachandran et al. |
| 6,469,253 B1 | 10/2002 | Saga et al. |
| 6,507,746 B2 | 1/2003 | Kaneko |
| 6,600,939 B1 | 7/2003 | Zhao |
| 6,642,182 B2 | 11/2003 | Kaneko |

FIGURE 3

DIE DRAWING AND ROLLING SCHEDULES FOR SELECTED EXAMPLES

75MF

*Die Drawing Schedule:*
13.35, 12.65, 11.67, 10.95, 10.0, (anneal), 9.22, 8.5, 7.83, 7.22, (anneal), 6.66, 6.14, 5.66, 5.22, (anneal), 4.81, 4.44, 4.09, 3.77, (anneal), 3.48, 3.20, 2.95, 2.72, (anneal), 2.51, 2.31, 1.96, (anneal), 1.81, 1.67, (anneal), 1.54

*Rolling Schedule:*
1.00, 0.80, (anneal), 0.65, 0.55, (anneal), 0.50

127MF

*Die Drawing Schedule:*
13.35, 12.65, 11.67, 10.95, 10.0, (anneal), 9.22, 8.5, 7.83, 7.22, (anneal), 6.66, 6.14, 5.66, 5.22, (anneal), 4.81, 4.44, 4.09, 3.77, (anneal), 3.48, 3.20, 2.95, 2.72, (anneal), 2.51, 2.31, 1.96, (anneal), 1.81, 1.67, (anneal), 1.54.

*Rolling Schedule*
1.3, (anneal), 1.2, (anneal), 1.1, 1.0, (anneal), 0.90, (anneal), 0.80, 0.70, 0.60

169MF

*Die Drawing Schedule:*
21.35, 19.65, 19.05, 18.86, (anneal), 16.35, 14.85, 13.35, (anneal), 12.6, 11.67, 10.95, 10.0, (anneal), 9.22, 8.5, 7.83, 7.22

*Rolling Schedule:*
10% thickness reduction each time to 5.2 mm, with annealing every 4 passes, then, as follows:

5.2, 5.1, 4.6, (anneal), 4.2, 3.8, 3.5, (anneal), 3.3, 3.0, 2.6, (anneal), 2.2, 1.9, (anneal), 1.7, 1.5, (anneal), 1.3, 1.15, (anneal), 1.0, 0.8, (anneal), 0.6, 0.50

Figure 4a

MF Super Conducting Tape Examples

| Sample code: | Filament Number | Rolled φ (mm) | Thickness (mm) | Width (mm) | Ic (A) | Je (A/cm$^2$) | Je* (A/cm width) |
|---|---|---|---|---|---|---|---|
| 9812B | 75 | 1.54 | 0.26 | 3.8 | 37.2-38.5 | 3750-3900 | 98-101 |
| 9812B | 75 | 1.54 | 0.42 | 3.37 | 49.5-52.0 | 3500-3700 | 148-154 |
| 9812B | 127 | 1.54 | 0.27 | 3.6 | 33.5 | 3450 | 93 |
| 9812B | 127 | 1.54 | 0.48-0.52 | 2.86-3.05 | 47.2 & 47.5 | 3250-3400 | 156 |
| 9812B | 127 | 1.31 | 0.27 | 3.05 | 27.0 | 3280 | 88.5 |
| 9812B | 127 | 1.31 | 0.55 | 2.84 | 42.2 | 2700 | 149 |
| 9812B | 75 | 2.13 | 0.37 | 4.54 | 61.0 | 3600 | 134 |
| 9812B | 127 | 2.13 | 0.52 | 4.52 | 84.0 | 3580 | 186 |
| 9812B | 127 | 4.22 | 0.54 | 10.0 | >120 | >2300# | >120# |

\* This figure is more important to the winding of cables - ie, how much current per layer or per unit tape width one can achieve.

\# Still to be determined - Ic greater than plant power supply capability of 120A

Figure 4b

Twisted MF Examples

| Sample code: | Filament Number | Rolled φ (mm) | Pitch (estimated) | Thickness (mm) | Width (mm) | Ic (Amps) | Je (Amps/cm$^2$) |
|---|---|---|---|---|---|---|---|
| 9812B | 127 | 1.54 | 5 (wire) 7 (tape) | 0.48 | 3.01 | 47.5 | 3290 |
| 9812B | 127 | 1.54 | 3 (wire) 5 (tape) | 0.48 | 2.92 | 42.2 | 3010 |
| 9812B | 127 | 1.54 | 3 (wire) 6 (tape) | 0.24 | 3.70 | 28.6 | 3220 |
| 9812B | 127 | 1.54 | 3 (wire) 6 (tape) | 0.26 | 3.54 | 29.0 | 3150 |

INTEGRATED TAPE

CROSS REFERENCE TO RELATED APPLICATIONS

This is a continuation application of application Ser. No. 09/661,251, filed Sep. 13, 2000 now abandoned, which is a continuation application of application Ser. No. PCT/AU99/00182, filed Mar. 18, 1999, which are hereby incorporated by reference in their entirety for all purposes.

FIELD OF THE INVENTION

The present invention relates to a superconducting tape and in particular to a superconducting tape of the powder-in-tube type.

BACKGROUND OF THE INVENTION

The invention has been developed primarily for carrying alternating current and will be described hereinafter with reference to that application. It will be appreciated however that the invention is not limited to that particular field of use and is also suitable for carrying DC current.

It is known to produce a superconducting wire by filling a tube of silver or silver alloy with particulate high-temperature ceramic superconductor. By way of example, it is known to use a superconductor selected from the class known as "BSCCO" superconductors. Of these, the sub-group known as BSCCO-2223 is most preferred.

Once the superconductor is placed in the tube further process steps occur. More particularly, the tube is rolled to reduce its cross-section to compact it. Further rolling is carried out to eventually flatten the tube which is heat treated at least once. This processing assists in aligning the plate-like grains of the superconductor.

It is also known to combine a plurality of the wires, referred to above, to form a superconducting tape. Each of the wires is referred to as a "filament" and the resultant tape as a multifilament tape. The filaments are initially reduced in cross section and placed within a common tube of silver or silver alloy. This common tube is then "textured", in that it is reduced in cross section and then flattened. This generally results in the filaments of particulate superconductor each having a thickness below about 40 micrometres. As the limits to the practicable width of the filament are not much more than 10 times its thickness, multiple filaments are needed to provide a substantial supercurrent capacity. In some cases the assembly is twisted to "transpose" the filaments with a view to equalising the supercurrent carried by individual filaments.

It has become accepted that the flexibility or other physical requirements limit the thickness of the finished tape to about 0.3 mm. Consequently, large numbers of tapes are needed to make superconducting power cables with adequate supercurrent capacity. It is known to use two and often more layers on a tubular support. However, the more tapes there are:

the more difficult it becomes to substantially equalise the distribution of supercurrent between the tapes; and the more the performance of each of the tapes is degraded by the magnetic field and other effects of the remaining tapes. This degradation is particularly applicable to AC losses.

It is an object of the present invention, at least in the preferred embodiment, to overcome or substantially ameliorate one or more of the disadvantages of the prior art, or at least to provide a useful alternative.

DISCLOSURE OF THE INVENTION

According to the invention there is provided a superconducting tape of the powder-in-tube type comprising multiple filaments of superconducting materials embedded in a silver-based matrix and characterised by a combination of a filament thickness less than 40 micrometres and an overall tape thickness in the range from 0.45 mm to 1.20 mm.

Preferably, tapes in accordance with the invention are made by either starting with a plurality of silver or silver alloy tubes of larger diameter than has been usual. Alternatively, the number of assembly-and-further-reduction steps are increased. Availability issues may necessitate the latter.

Preferably also, the tape includes at least 75 filaments. Even more preferably, the tape includes 127 filaments, although in other embodiments the tape includes 169 filaments. As will be appreciated by those skilled in the art, the dimensions referred to above accommodate a wide range of filament numbers. In practice, it is generally geometrical constraints on packing equal round components into approximately round assemblies that limit the number if filaments.

In a preferred form, the superconducting material is BSCCO-2223.

Preferred tape thicknesses range from about 0.55 mm to 1.00 mm, and most especially from about 0.55 mm to 0.80 mm (both inclusive). More preferably, the overall tape width is in the range of about 1.8 mm to 6.0 mm.

Preferably, the filaments extend longitudinally in the tape, but preferably they are "transposed" so as to occupy progressively different cross-sectional positions as they progress along the length of the tape. More preferably, the transposition is achieved by twisting the precursor in round or other compact form so that the filaments are approximately helical prior to flattening into tape. A transposition cycle, referred to as "pitch", is less than about 10 mm, the exact pitch depending on the magnetic field of the particular superconducting cable design. However, this is difficult to achieve as the transposition cycle is elongated substantially in the flattening and subsequent reduction in texturing. Preferably, therefore, the preform is twisted in stages during its reduction in compact form. Preferably also, the preform is annealed between at least some of the twisting steps. More preferably, the twisting is always in the same direction and is applied as soon as all the constituents are assembled. Even more preferably, the twisting is applied at one or more of the following times:

after any chosen intermediate reduction or reductions;

after the final reduction before flattening; or at two or more of these stages.

Where the preform is assembled in several steps, sub-units may also be twisted, but the benefit of this, apriori, is not thought to be substantial.

Preferred embodiments of the invention include superconducting cables and other conductors made with the tapes described above.

The available developmental designs of superconducting cables use conductors comprising superconducting tapes helically applied to a tubular former. This former also serves as a coolant duct. Economic considerations dictate that the energy transmission capacity of a superconducting cable be large. This arises from that fact that use of such cables at modest current levels often results in refrigeration losses which exceed the losses due to the resistance of a conventional copper conductor of similar capacity. Moreover, the formers and the cooling systems are designed to perform with three or four layers of tapes wound onto the former. Use of tapes according to the present invention, however, are anticipated to allow comparable capacity to be achieved with only one or two layers of tapes, permitting the capacities of tapes to be used substantially more efficiently.

In accordance with preferred embodiments of the invention the tapes are used, grouped and insulated, to make windings for superconducting transformers and other superconducting electrical machines.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

BRIEF DESCRIPTION OF THE DRAWINGS

Preferred embodiments of the invention will now be described, by way of example only, with reference to the accompanying drawings in which:

FIG. 3 presents the die drawing and rolling schedules for the 75, 127 and 169 MF examples of superconducting tapes according to the invention; and FIG. 4a presents experimentally determined characteristics of the 75 and 127 MF examples rolled to a variety of preferred thicknesses and widths and FIG. 4b details the experimental results of characteristics of the 127 MF example, again for a variety of preferred thicknesses and widths, having been twisted.

PREFERRED EMBODIMENTS OF THE INVENTION

Figure 1:
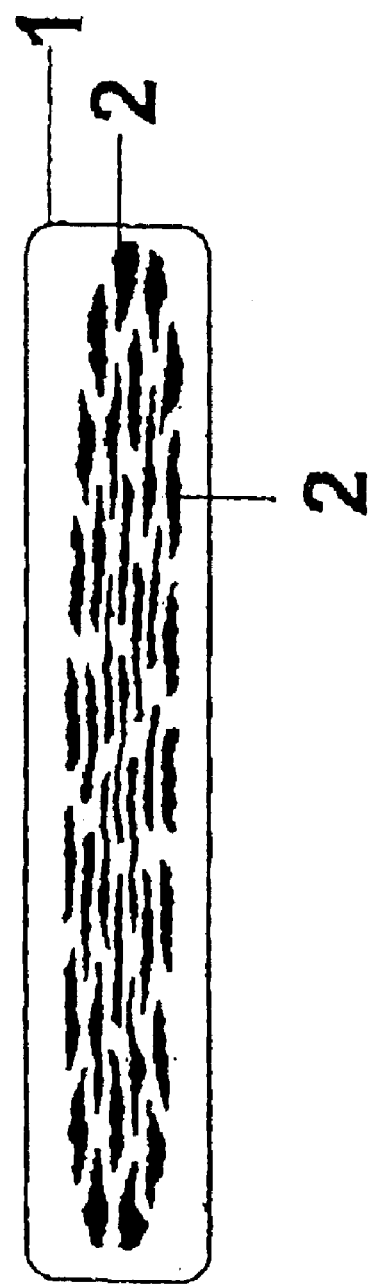
FIG. 1 is a diagrammatic cross-section through a superconducting tape according to the invention.

In the manufacture of the superconducting tape of this example, BSCCO-2223 precursor powder is first filled into a pure silver tube. For the example where the number of filaments included is 75, the silver tube has internal and external diameters of 1.9 and 14.1 mm respectively and degassed by placing in a cool oven (in air), heating to bout 830° C. and holding for 5 hours. After cooling, the assembly is drawn to a diameter of 1.11 mm in a series of stages with a reduction in the area of about 15% at each stage, annealing at 500° C. after 16 steps and thereafter every 3 subsequent steps. Seventy-five cut lengths of the drawn assembly can now be arranged (in five concentric layers of 3, 9, 15, 21, 27) inside another length of the same silver tube. The resulting assembly is further drawn to a diameter of 1.31, 1.54 or 2.31 mm, again in steps of about 15% reduction in area.

For the example where the number of filaments is 127, the precursor powder is filled into a pure silver tube with internal and external diameters of 15.0 mm and 18.0 mm respectively and degassed by placing in a cool oven (in air), heating to about 830° C. and holding for 5 hours. After cooling, the assembly is drawn to a diameter of 1.11 mm by a series of stages with a reduction in area of about 15% at each stage, annealing at 500° C. after 16 steps and thereafter every 3 subsequent steps. One-hundred and twenty-seven lengths of the drawn assembly can now be arranged (in seven concentric layers of 1, 6, 12, 18, 24, 30 and 36) inside another length of the same silver tube. The resulting assembly is further drawn to a diameter of 1.31, 1.54 or 2.31 mm, again with a reduction in area of 15% at each stage.

For the example where the number of filaments is 169, the precursor powder is filled into a pure silver tube with internal and external diameters of 21.5 mm and 24.0 mm respectively and degassed by placing in a cool oven (in air), heating to about 830° C. and holding for 5 hours. After cooling, the assembly is drawn to a diameter of 1.42 mm by a series of stages with a reduction in area of about 15% at each stage, annealing at 500° C. after 16 steps and thereafter every 3 subsequent steps. One-hundred and sixty-nine cut lengths of the drawn assembly can now be arranged (in 8 concentric layers of 1, 6, 12, 18, 24, 30, 36 and 42) inside another length of the same silver tube. The resulting assembly is further drawn to a diameter of 7.22 mm, again with a reduction in area of about 15% at each step. Thus far, the process has been entirely conventional.

The preferred process for the 75 filament assembly will now be described, however, the die drawing and rolling schedules for the 75, 127 and 169 multifilament examples are presented in FIG. 3. The assembly is now twisted about its respective longitudinal axis by relative rotation of its ends (for long lengths a drum twister could be used) to a pitch of approximately 60 mm and then annealed for a minute at 500–700° C. The assembly is then further drawn in two stages to 3.2 mm and further twisted to a pitch of 60 mm and annealed again under similar conditions. A further twist to a pitch of 20 mm and another similar anneal follows immediately and the twisted assembly is then drawn to a diameter of 2.8 mm in two stages and then further twisted in stages to a final pitch of 6 mm with anneals (under the same conditions as before) at pitches of 15, 12, 10, 8 and 6 mm. That is, for the example of the 75 multifilament assembly, the twisting is done at the 1.54 mm diameter drawings stage, and annealed every 6 full twists of the wire thereafter.

At this stage, the assembly is then rolled to form a flat tape in steps as follows, using a roll diameter of 200 mm, with the intermediate heat-treatment steps as shown:

1. rolls successively with a roll gap of 1 mm;
2. anneal under the same conditions as before;
3. roll again with a gap of 0.8 mm;
4. place in a cool oven, in air, heat to 840° C. and hold for 50 hours;
5. after cooling to room temperature, roll with a gap of 0.55 mm (about 15% reduction in area); and
6. place the assembly in a cool oven in an atmosphere of 7.5% oxygen, balance nitrogen, heat to 825° C., hold for 40 hours and cool over a further 40 hours to 785° C.

Figure 2:
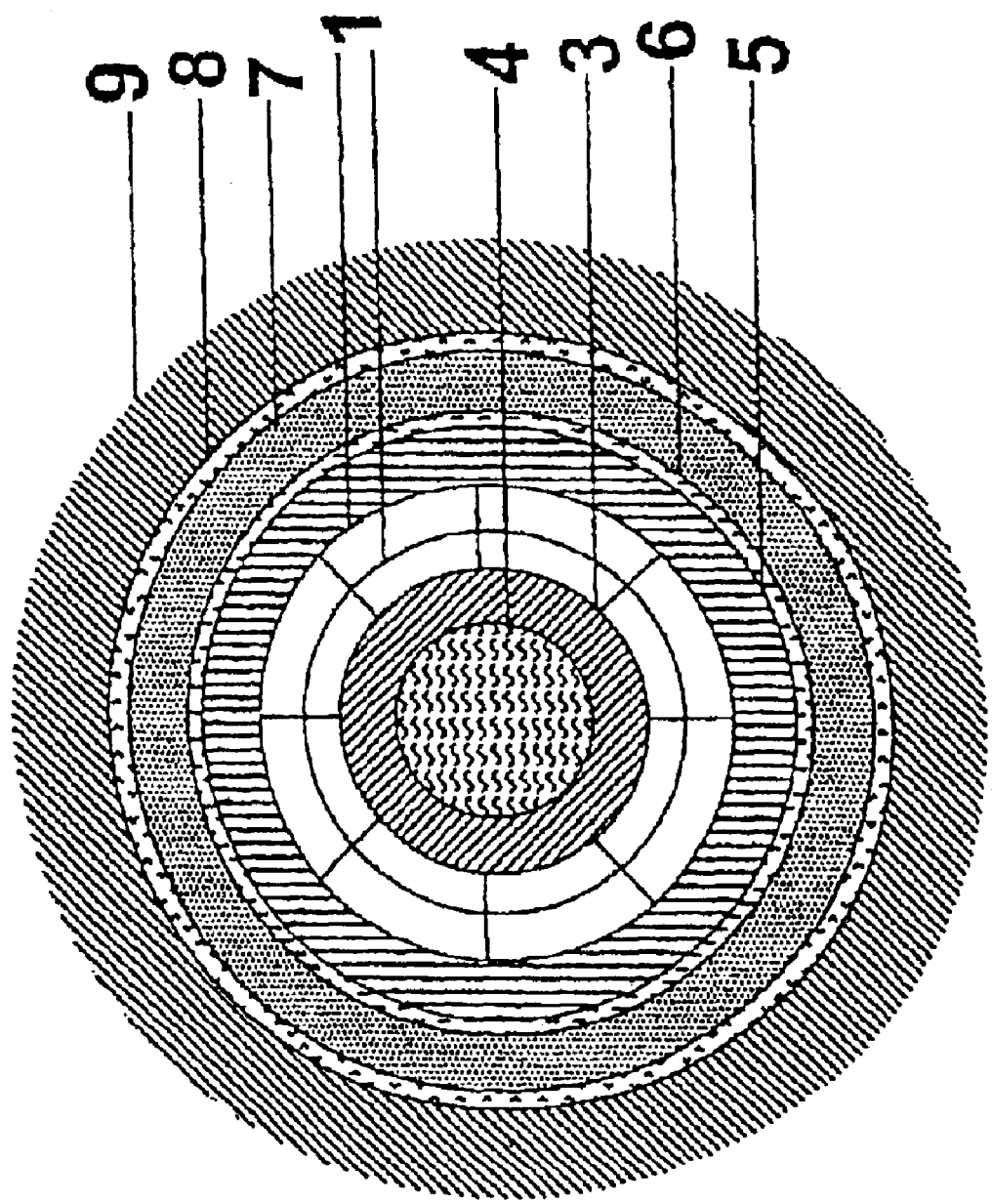
FIG. 2 is a diagrammatic cross-section through a superconducting cable including the tape of FIG. 1.

This results in a superconducting tape 1, shown in FIG. 1, with a thickness of about 0.6 mm and a width of about 3 mm and comprising 91 superconductor filaments 2 with cross-sectional dimensions in the range 10–40$\mu$m thick and 0.1 to 0.4 mm wide with a transposition cycle of about 5 to 15 mm. The flexibility of the tape, as indicated by the radius at which one cycle of one-way bending degrades the critical current of the tape by 5% is about 50 mm. This makes it unsuited to winding of small diameter coils and makes it advisable to store the tape on large diameter supports, but it is no problem for use in superconducting power cables, such as diagrammatically indicated in FIG. 2.

In this Figure, a tubular copper former 3 defines coolant duct 4 through which liquid nitrogen (and/or cold gaseous nitrogen) circulates to maintain the required temperature for superconducting operation. On this former are helically laid superconducting tape 1 in two layers. The layers may be of opposite hand or the same hand, but in the latter case preferably of different pitch. For the purpose of illustration, if the outer diameter of the former 3 is 50 mm and the lay angle of the tapes 10°(corresponding to a lay length of 2.9 m), the longitudinal bending radius of the tape is over 800 mm, at which degradation is quite insignificant. In another illustration, using a former 3 with an outer diameter of 50 mm and a lay angle of 20°, the longitudinal bending radius of the tape is 213 mm, at which degradation is again insignificant. The cable also needs to provide thermal insulation 5, an electrical screen 6, electrical insulation 7, a further electrical screen 8 and containment 9.

In an alternative cable construction, not illustrated, the superconducting tapes are mounted inside channel sections of copper (or aluminium) to provide mechanical protection during manufacture and an alternative current path in case superconducting state should be lost, as more filly described in WO96/41352. Such channel sections may be laid on a tubular support (as 3) or may be interlocked so as to be self-supporting. In each case, the use of only two layers of tapes substantially reduces AC losses compared with a cable having four layers with the same aggregate cross-sectional area.

Experimentally determined characteristics of the 75 and 127 MF examples rolled to a variety of preferred thicknesses and widths are presented in FIG. 4a. FIG. 4b details the experimental results of characteristics of the 127 MF example, again for a variety of preferred thicknesses and widths, having been twisted. The data presented in FIG. 4a and 4b was obtained using multifilament tapes at 77 K.

Preferably, the aspect ratio of filament 2, defined as filament height to filament width, is at least 1:10. In other embodiments, the filament aspect ratio is substantially less than 1:10. These other embodiments are advantageous in some applications such as the lay up of cables since the one-dimensional current density, defined as the ratio of the critical current to the tape width, is about twice that of embodiments having a filament aspect ratio of 1:10.

Although the invention has been described with reference to particular examples it will be appreciated by those skilled in the art that it may be embodied in many other forms.

What is claimed is:

1. A superconducting tape having a rectangular cross section comprising multiple filaments of super conducting material embedded in a silver or silver alloy based matrix and characterised by the combination of a filament thickness of less than about 40 micrometers and an overall tape thickness in the range from about 0.45 to 1.20 mm.

2. A tape according to claim 1 wherein the filament thickness is in the range of about 10 micrometres to less than about 40 micrometres.

3. A tape according to claim 1 in which the number of filaments in the tape is over 75.

4. A tape according to claim 1 in which the superconducting material is BSCCO-2223.

5. A tape according to claim 1 having a thickness from about 0.55 mm to 1.00 mm, the tape having a width of between 1.8 mm to 6 mm.

6. A tape according to claim 1 with a thickness from about 0.6 mm to 0.8 mm.

7. A tape according to claim 1 in which the filaments are transposed so as to occupy progressively different cross-sectional positions as they progress along the length of the tape.

8. A tape according to claim 7 having a transposition cycle shorter than 20 mm.

9. A tape according to claim 1 wherein a filament aspect ratio, defined as the ratio of the filament height to the filament width, is at least 1:10.

10. A tape according to claim 1 wherein the aspect ratio is substantially less than 1:10.

11. A superconducting cable made with a tape according to claim 1.

12. A superconducting cable according to claim 11 wherein the superconducting tapes are helically applied to a tubular formula which also serves as a coolant duct.

13. A superconducting cable according to claim 11 in which there are no more than two layers of superconducting tapes.

14. A conductor comprising tapes in accordance with claim 1 wherein the tapes are grouped together and include an insulating cover.

15. A superconducting transformer wound with the conductor in accordance with claim 14.

* * * * *